United States Patent [19]

Pas et al.

[11] Patent Number: 5,895,620
[45] Date of Patent: Apr. 20, 1999

[54] PROCESS FOR ENCAPSULATING AN ELECTRONIC COMPONENT

[75] Inventors: Ireneus Johannes T. M. Pas, Rozendaal; Johannes Gerard L. Nelissen, Cadier en Keer, both of Netherlands

[73] Assignee: "3P" Licensing B.V., Zevenaar, Netherlands

[21] Appl. No.: 08/581,132

[22] Filed: Dec. 29, 1995

[30] Foreign Application Priority Data

Dec. 29, 1994 [NL] Netherlands ............................ 9402233

[51] Int. Cl.$^6$ ........................... B29C 45/14; B29C 70/70
[52] U.S. Cl. ................... 264/272.13; 264/272.17
[58] Field of Search ........................ 264/272.11, 272.13, 264/272.17, 328.4, 328.5, 328.17

[56] References Cited

U.S. PATENT DOCUMENTS

| | | | |
|---|---|---|---|
| 3,911,075 | 10/1975 | Boesch et al. | 264/328.5 |
| 3,969,461 | 7/1976 | Boesch et al. | 264/328.5 |
| 4,327,369 | 4/1982 | Kaplan | 264/272.11 |
| 4,370,292 | 1/1983 | Yanase et al. | 264/272.17 |
| 4,853,442 | 8/1989 | Nguyen | 525/471 |
| 4,972,031 | 11/1990 | Choate et al. | 525/535 |
| 5,277,864 | 1/1994 | Blatz | 264/328.17 |
| 5,326,516 | 7/1994 | Brannon | 264/143 |
| 5,364,914 | 11/1994 | Choate et al. | 525/505 |
| 5,443,775 | 8/1995 | Brannon | 264/143 |

FOREIGN PATENT DOCUMENTS

| | | |
|---|---|---|
| 052611 | of 0000 | European Pat. Off. . |
| 571582 | of 1982 | European Pat. Off. . |
| A044136 | of 1982 | European Pat. Off. . |
| A104543 | of 1984 | European Pat. Off. . |
| A151553 | of 1985 | European Pat. Off. . |
| A211147 | of 1987 | European Pat. Off. . |
| A365168 | of 1990 | European Pat. Off. . |
| 2545653 | of 1984 | France . |

*Primary Examiner*—Angela Ortiz
*Attorney, Agent, or Firm*—Edmund M. Jaskiewicz

[57] ABSTRACT

Process for encapsulating an electronic component, in particular an integrated circuit, with an encapsulating material, at least comprising the steps of:

placing the component to be encapsulated in a cavity of a mold;

introducing the encapsulating material at elevated temperature into the cavity between the mold and the component to be encapsulated;

hardening the encapsulating material; and releasing the encapsulated component from the cavity, the encapsulating material used comprising 40–65% by weight of the engineering thermoplast and 60–35% by weight of the reactive solvent.

3 Claims, No Drawings

PROCESS FOR ENCAPSULATING AN ELECTRONIC COMPONENT

BACKGROUND OF THE INVENTION

The present invention in the first instance relates to a process for encapsulating an electronic component, in particular an integrated circuit, with an encapsulating material which comprises an engineering thermoplast and a reactive solvent, at least comprising the steps of:

placing the component to be encapsulated in a cavity of a mould;

introducing the encapsulating material at elevated temperature into the cavity between the mould and the component to be encapsulated;

hardening the encapsulating material; and releasing the encapsulated component from the cavity.

DISCUSSION OF THE PRIOR ART

Such a process is generally known and is employed for encapsulating a variety of electronic components.

The term engineering thermoplast refers to thermoplasts having a relatively high softening temperature, i.e. a glass transition temperature or a melt temperature which is so high that the encapsulation remains dimensionally stable during the use of, for example, an integrated circuit, where high temperatures are frequently encountered, and where a considerable amount of heat can be generated. It will be evident that, at the temperatures encountered, the encapsulation must not deform. It will further be evident that the glass transition temperature, in particular in the case of integrated circuits, cannot be too high, in order to prevent irremediable damage being inflicted on the circuit during the encapsulation process.

These thermoplastic encapsulating plastics have the advantage that the encapsulation exhibits ductile fraction behaviour and the encapsulation starting material is not subject to reactions or the like which make processing impossible after extended periods.

Reactive solvents used, generally thermosets, usually exhibit a brittle fracture behaviour. Thermosets have to be stored and transported under cold conditions since the curing reaction takes place even at room temperature.

A drawback of engineering thermoplasts is that, owing to the high softening temperature, the processing temperature is correspondingly high, degradation of the plastic very often taking place in the process. Furthermore, engineering thermoplasts exhibit poor adhesion to polar surfaces of electronic components such as metal surfaces of integrated circuits.

Although the use of encapsulating materials for the above method comprising a thermoplast and a reactive solvent are known the weight ratio thereof used in the prior art is limited. The amount of thermoplast is relatively low with respect to the amount of reactive solvent. In this respect reference is made to the following documents.

EP-A-0 365 168 discloses a moulding composition comprising a thermoset and a thermoplast. The amount of thermoplast used is maximum 35% by weight and the optimum specified is at about 25% by weight. It is preferred in said European application to obtain a composition in which each of the components after curing is present at least partly as a continuous phase providing a network of the phases in the mass.

EP-A-0 151 553 discloses an epoxy resin/polysulphone moulding composition. The amount of polysulphone is 6–14% by weight.

EP-A-0 211 147 discloses an epoxy resin composition comprising 0.5 to 10 parts by weight of a polysulphone resin.

Moulding compositions with relatively low amounts of thermoplast have the disadvantage that the properties thereof are dominated by the thermoset. That is these still posses a relatively brittle fracture behaviour, are difficult to handle due to the thermoset, i.e. needs to be stored at low temperatures, and encapsulated products need to be post-cured.

SUMMARY OF THE INVENTION

The object of the present invention is to provide a solution for the abovementioned drawbacks and to that end is characterized in that the encapsulating material used comprises 40–65% by weight of the engineering thermoplast and 60–35% by weight of the reactive solvent. Preferably the encapsulating material used comprises 50–60% by weight of the engineering thermoplast and 50–40% by weight of the reactive solvent and most preferred the mixing ratio of thermoplast and reactive solvent is 1:1.

During the hardening of the encapsulating material according to the invention a phase separation occurs and a continuous thermoplast phase containing a dispersed reactive solvent phase is obtained. It was found, surprisingly, that in the presence of a polar surface, for example a metal surface of an integrated circuit, a preferential phase separation occurs near the surface, a thin layer of reactive solvent being deposited on the surface. As a result, adhesion of the encapsulating material after curing is comparable with the adhesion between a commonly used thermoset and an electronic component.

If the amount of thermoplast is higher than 65% by weight then the viscosity of the composition will be too high, inhibiting processing, and the adhesion to the encapsulated product will be insufficient.

The encapsulating material blend according to the invention has further excellent ignition characteristics, so that the addition of commonly used halogen-containing flame retardants is no longer necessary. This has a beneficial effect on the re-use of the material. Additionally, the material can thus be incinerated without any problems. In the case of re-use, the thermoplast can be separated from the reactive solvent and possibly be used again.

Commonly used encapsulations comprising relatively high amounts of thermosets should, after the moulding process and the release of the encapsulated component from the cavity, additionally undergo a supplementary curing process, often in an oven for 4–5 h at elevated temperature. Because of the presence of the specific amount of thermoplast according to the invention, this post-curing operation is unnecessary, since the product, after being released from the cavity, already has sufficient inherent strength. Full curing of the thermoset can take place over time.

The reactive solvent according to the invention is not specifically limited but preferably comprises a reactive component which can polymerize, cross-link or both.

Advantageously said solvent is selected from unsaturated olefins (e.g. hexadiene), unsaturated aromatic olefins (e.g. styrene, divinylbenzene), cyclic ethers (e.g. propylene oxyde), cyclic amides (e.g. caprolactam), acrylates (e.g. methylmethacrylate), acrylonitrile, thermosetting resins (e.g. unsaturated polyesters), epoxy resins and organic isocyanates, with their respective curing agents, polyamides, aliphatic and alicyclic amines, aromatic amines (e.g. diaminodiphenylsulphone), carboxylic acids, carboxylic acid anhydrides (e.g. phtalic acid anhydride), phenolics, polyalcohols, and mixtures thereof. How the polymerisation and/or cross-linking of the reactive solvent is effected is depending on the specific selection of the reactive solvent and is known to the ordinary expert.

Without Applicant wishing to be limited to any particular mechanism, the blend of thermoplast and reactive solvent is found to behave as follows during the process according to the invention. During processing, a solution of the thermoplast and the reactive solvent is obtained. The thermoplast therefore does not melt, but is, as it were, lubricated by the reactive solvent and as a result is able to form a homogeneous blend with said solvent. Upon hardening of the solvent phase separation occurs, the thermoplast forming the continuous phase and the reactive solvent forming the dispersed phase. It was found that the blend of thermoplast/reactive solvent can be processed at a lower temperature than the glass transition temperature or the melting temperature of the thermoplast.

The encapsulating material according to the invention can be produced by blending a reactive solvent with a thermoplast, the former frequently being a liquid product and the latter usually being a powder. As a result of the thermoplast being softened during blending, it is possible to obtain, after cooling of the blend, a homogeneous solution of reactive solvent and thermoplast, the solvent being encapsulated in such a way, owing to the presence of the vitrified thermoplast, that the full hardening reaction of the solvent is inhibited, and storage and transportation can take place at room temperature. The latter being very important in the case thermosets are used as a reactive solvent.

There is no particular restriction on thermoplastics which can be used with the present invention, apart from the fact that they must, of course, be able to withstand the temperatures which occur during operation of electronic components such as integrated circuits. Examples of engineering thermoplasts are thermoplasts of polyethyleneterephthalate, polybutyleneterephthalate, polycarbonate, polyamide, polyketone, polyetherketone etherketone ketone, polyetherketoneketone, polyphenylenesulphide, polyphenylene ether, polyphenylene sulphide sulphone, polysulphone, polyethersulphone, polyimide, polyetherimide, polyamide imide, and polyimide sulphone, and mixtures thereof.

In the case of conventional encapsulating methods, which employ thermosets, it is preferable, in view of the production rate, to employ rapid curing agents, curing agents which are able to cure thermosetting plastic within a very short time, but in practice such curing agents are found to cause such stress in the thermosetting material that the end product becomes brittle. In the case of the present invention this problem does not occur and the rapid curing agents can be employed.

The encapsulating material according to the invention may further include commonly used additives such as solvents, fillers, additives which assist the processing of plastics, etc., provided that these materials do not interfere with the phase structure of the encapsulating material according to the invention when used for encapsulating an electronic component, i.e. the continuous thermoplast phase and the dispersed reactive solvent phase.

It was found that the viscosity of the blend of thermoplast/thermoset at the processing temperature is lower than that of the thermoplast on its own, and as a result the encapsulating material in the case of an amorphous thermoplast is advantageously processed at a temperature not higher than about the glass transition temperature of the thermoplast. In the case of semi-crystalline thermoplasts the processing temperature is preferably below the crystallisation temperature thereof.

The invention further provides an encapsulating material, in particular intended for encapsulating electronic components, at least comprising 40–65% by weight of an engineering thermoplast and 60–35% by weight of a reactive solvent. Preferably said material comprises at least 50–60% by weight of an engineering thermoplast and 50–40% by weight of a reactive solvent.

Finally an electronic component, in particular an integrated circuit, provided with an encapsulation made of an encapsulating material according to the invention is provided.

The invention is explained below in more detail with reference to an example.

EXAMPLE

Various proportions of a thermoplast were blended with a thermoset. The thermoplast used was a polysulphone thermoplast, BASF's Ultrason S1010, and the thermoset used was an epoxy resin, viz. the diglycidyl ether of bisphenol A, Shell's Epikote 828EL, the curing agent being the diamine curing agent LONZA M-DEA (gelling time ±20 min at a temperature of 170° C.).

The polysulphone (PSU) was pulverized. Then such amounts of PSU and epoxy resin were weighed that the ultimate weight ratios, i.e. after the addition of the requisite amount of M-DEA, PSU: (epoxy resin+curing agent) were equal to 60:40 and 50:50, respectively. The weighed amounts of PSU and epoxy resin were blended to a paste in a Brabender kneader (60 cm$^3$) with an initial temperature of 130° C. During blending, the torque of the kneader was measured and, at the instant it increased, the temperature was gradually raised to 200° C. over 40 min. After an homogeneous blend had been obtained, the temperature was lowered to 140° C. Finally, 8.56 g and 10.7 g, respectively, of the M-DEA curing agent were admixed over 5 min, after which the blend was removed from the kneader and was cooled to room temperature as rapidly as possible. The table below gives the glass transition temperature and the viscosity at 170° C. of the various weight ratios. As can be clearly seen, the glass transition temperature and the viscosity decrease with increasing proportions of thermoset.

| Weight ratio Thermoplast:thermoset | $T_g$ [° C.] | Viscosity at 170° C. [Pa.s] |
| --- | --- | --- |
| 100:0 | 190 | >10$^9$ |
| 60:40 | 70 | 10$^3$ |
| 50:50 | 60 | 50 |

The viscosity was measured by means of a Rheometrics in dynamic conditions with an effective shear rate of 10 s$^{-1}$. The temperature of 170° C. is a commonly used moulding temperature when encapsulating integrated circuits.

A 50:50 blend provided good encapsulation for the integrated circuits.

What is claimed is:

1. Process for encapsulating integrated circuits, with an encapsulating material which comprises an engineering thermoplast dissolved in a reactive solvent, at least comprising the steps of:

placing the component to be encapsulated in a cavity of a mould;

introducing the encapsulating material at elevated temperature into the cavity between the mould and the component and encapsulating the component;

hardening the encapsulating material; and releasing the encapsulated component from the cavity, wherein the encapsulating material used comprises 50–60% by weight of the engineering thermoplast and 50–40% by weight of the reactive solvent, whereby upon hardening of the encapsulating material a phase separation occurs, the thermoplast forming a continuous phase and the reactive solvent forming a dispersed phase.

2. Process according to claim 1, wherein the reactive solvent comprises a reactive component which can polymerize, cross-link or both.

3. Process according to claim 1, wherein the reactive solvent is selected from unsaturated olefins, unsaturated aromatic olefins, cyclic ethers, cyclic amides, acrylates, acrylonitrile, thermosetting resins, polyamides, aliphatic and alicyclic amines, aromatic amines, carboxylic acids, carboxylic acid anhydrides, phenolics, polyalcohols and mixtures thereof.

* * * * *